(12) United States Patent
Igarashi et al.

(10) Patent No.: US 6,604,953 B2
(45) Date of Patent: Aug. 12, 2003

(54) ANISOTROPICALLY CONDUCTIVE SHEET AND CONNECTOR

(75) Inventors: Hisao Igarashi, Chuo-ku (JP); Katsumi Sato, Chuo-ku (JP)

(73) Assignee: JSR Corporation, Tokyo (JP)

( * ) Notice: Subject to any disclaimer, the term of this patent is extended or adjusted under 35 U.S.C. 154(b) by 51 days.

(21) Appl. No.: 09/904,890

(22) Filed: Jul. 16, 2001

(65) Prior Publication Data

US 2001/0049208 A1 Dec. 6, 2001

(51) Int. Cl.⁷ .............................................. H01R 13/648
(52) U.S. Cl. ............................................. 439/91; 439/70
(58) Field of Search ............................... 439/66, 68, 70, 439/91

(56) References Cited

U.S. PATENT DOCUMENTS 6,044,548 A * 4/2000 Distefano 6,168,442 B1    1/2001   Naoi
6,176,724 B1 *  1/2001   Klatt et al. ............... 439/326

FOREIGN PATENT DOCUMENTS

| JP | 9-223860   | 8/1997  |
| JP | 11-40224   | 2/1999  |
| JP | 2000-292485 | 10/2000 |

* cited by examiner

*Primary Examiner*—Khiem Nguyen
(74) *Attorney, Agent, or Firm*—Oblon, Spivak, McClelland, Maier & Neustadt, P.C.

(57) ABSTRACT

An anisotropically conductive sheet comprises an anisotropically conductive functional region part exhibiting conductivity in its thickness-wise direction and an insulating peripheral region part located about the functional region part. The thickness of the functional region part is greater than that of the peripheral region part. The difference in thickness makes a space for inserting a holding tip part of a carrier between a target to be electrically connected and an upper surface of the peripheral region part.

18 Claims, 3 Drawing Sheets

US 6,604,953 B2

ANISOTROPICALLY CONDUCTIVE SHEET AND CONNECTOR

BACKGROUND OF THE INVENTION

1. Field of the Invention

The present invention relates to an anisotropically conductive sheet and a connector which are suitable for use, for example, in electrical connection between circuit devices of electronic parts and the like, or in inspection apparatus for circuit devices such as printed circuit boards and semiconductor integrated circuits.

2. Description of the Background Art

An anisotropically conductive elastomer sheet exhibits conductivity only in its thickness-wise direction or has pressure-sensitive conductive path-forming parts exhibiting conductivity only in its thickness-wise direction when it is pressurized in the thickness-wise direction. Since the anisotropically conductive elastomer sheet has features that short electrical connection can be achieved without using any means such as soldering or mechanical fitting, and that flexible connection is feasible with mechanical shock or strain absorbed therein, it is widely used as a connector for achieving electrical connection between a circuit device, for example, a printed circuit board, and a leadless chip carrier, liquid crystal display panel or the like in fields of, for example, electronic computers, electronic digital clocks, electronic cameras and computer key boards.

On the other hand, in electrical inspection of circuit devices such as printed circuit boards and semiconductor integrated circuits, it is conducted to interpose an anisotropically conductive elastomer sheet between an electrode region to be inspected of a circuit device (hereinafter may also be referred to as "a circuit board to be inspected"), which is an inspection target, and an electrode region for inspection of a circuit board for inspection in order to achieve electrical connection between electrodes to be inspected formed on at least one surface of the circuit device to be inspected and electrodes for inspection formed on the surface of the circuit board for inspection.

As such anisotropically conductive elastomer sheets, there have heretofore been known those of various structures. For example, Japanese Patent Application Laid-Open No. 93393/1976 discloses anisotropically conductive elastomer sheets obtained by uniformly dispersing metal particles in an elastomer, and Japanese Patent Application Laid-Open No. 147772/1978 discloses anisotropically conductive elastomer sheets obtained by unevenly distributing particles of a conductive magnetic material in an elastomer to form many conductive path-forming parts extending in the thickness-wise direction thereof and insulating parts for mutually insulating each of them.

However, since such an anisotropically conductive sheet is in the form of a flat plate both surfaces of which are smooth, or of a flat plate as a whole despite the surfaces of the conductive path-forming parts thereof slightly project from the surfaces of the insulating parts thereof, the following problem is offered when it is used in, for example, electrical inspection of a circuit device to be inspected.

Namely, the circuit device to be inspected may be carried by a carrier in some cases, being held by holding claws of the carrier, which engages with the lower surface of the circuit device at a peripheral edge part thereof, in a state that electrodes to be inspected provided on the lower surface thereof have been exposed. In the anisotropically conductive sheet having an even thickness as a whole, however, a peripheral edge part of the anisotropically conductive sheet comes into contact with the holding claws of the carrier. Therefore, the circuit device to be inspected cannot be accurately arranged or positioned at a prescribed position, and so it is difficult to achieve electrical connection between the electrodes to be inspected of the circuit device to be inspected and the conductive path-forming parts of the anisotropically conductive sheet.

SUMMARY OF THE INVENTION

The present invention has been made on the basis of the foregoing circumstances and has as its object the provision of an anisotropically conductive sheet and a connector, which are each capable of achieving its accurate electrical connection easily to a target to be electrically connected even when the target is held and carried by a carrier or the like.

In the aspect of the present invention, there is thus provided an anisotropically conductive sheet comprising an anisotropically conductive functional region part exhibiting conductivity in its thickness-wise direction and an insulating peripheral region part located about the functional region part, wherein the thickness of the functional region part is greater than that of the peripheral region part, and the upper surface of the functional region part is projected from the upper surface of the peripheral region part and connected to the upper surface of the peripheral region part with a difference in level.

The difference in level between the upper surface of the functional region part and the upper surface of the peripheral region part may make a space for inserting a holding tip part of a carrier which engages with the lower surface of a peripheral edge part of a circuit device to be inspected arranged on the upper surface of the functional region part.

In the anisotropically conductive sheet according to the present invention, the functional region part may preferably comprise a plurality of conductive path-forming parts each extending in the thickness-wise direction of the sheet and arranged in a state insulated from one another by insulating parts.

In the anisotropically conductive sheet as above, a ratio A of the thickness of each of the conductive path-forming parts to the maximum diameter thereof may preferably be higher than 1.5, but not higher than 8, and a ratio B of the thickness of the conductive path-forming part to the minimum arrangement pitch of the conductive path-forming parts may preferably be not lower than 1, but not higher than 3.

In the anisotropically conductive sheet as above, a ratio C of the thickness of the functional region part to the thickness of the peripheral region part may preferably be higher than 1, but not higher than 5.

In the anisotropically conductive sheet as above, the size of the difference in level between the upper surface of the functional region part and the upper surface of the peripheral region part may preferably 0.1 mm or greater.

In an aspect of the present invention, there is also provided a connector formed of the anisotropically conductive sheet described above.

According to the construction described above, the functional region part has a greater thickness than that of the peripheral region part, and the upper surface thereof is projected from the upper surface of the peripheral region part and connected to the upper surface of the peripheral region part with a difference in level, whereby a space for inserting a holding tip part of a carrier is defined between a target to be electrically connected and the upper surface of the peripheral region part, and after all it is avoidable for the tip part of the carrier to come into contact with the anisotropically conductive sheet to interfere with the accurate location of the target. As a result, the target can be arranged at the prescribed position, and accurate electrical connection between the target and the anisotropically conductive sheet can be achieved with ease.

BRIEF DESCRIPTION OF THE DRAWINGS

The above and other objects, features and advantages of the present invention will become apparent from the following description and the appended claims, taken in conjunction with the accompanying drawings, in which:

DETAILED DESCRIPTION OF THE PREFERRED EMBODIMENTS

The present invention will hereinafter be described in details with reference to the accompanying drawings.

Figure 1:
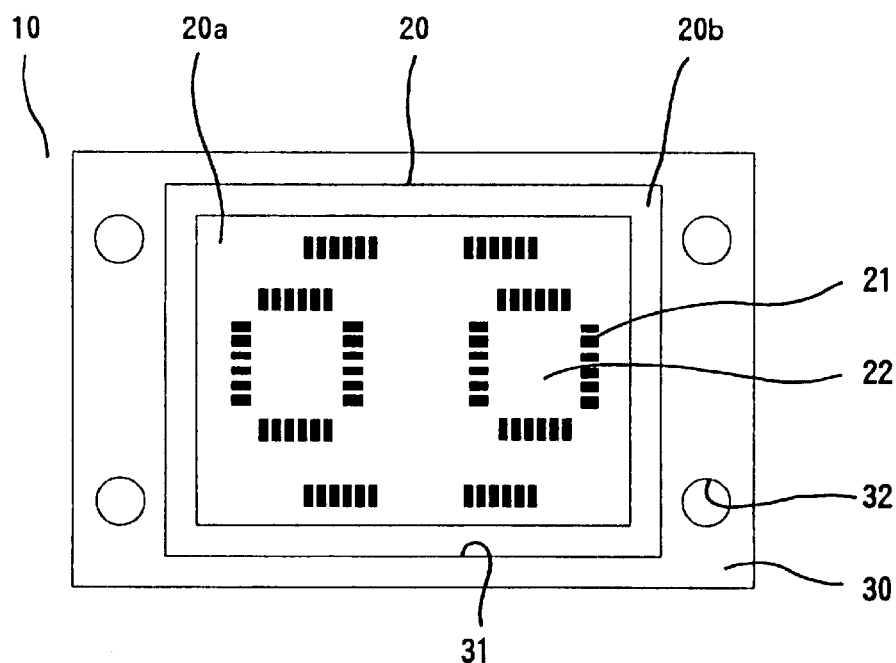
FIG. 1 is a plan view illustrating the whole construction of an exemplary anisotropically conductive sheet according to the present invention.
Figure 2:
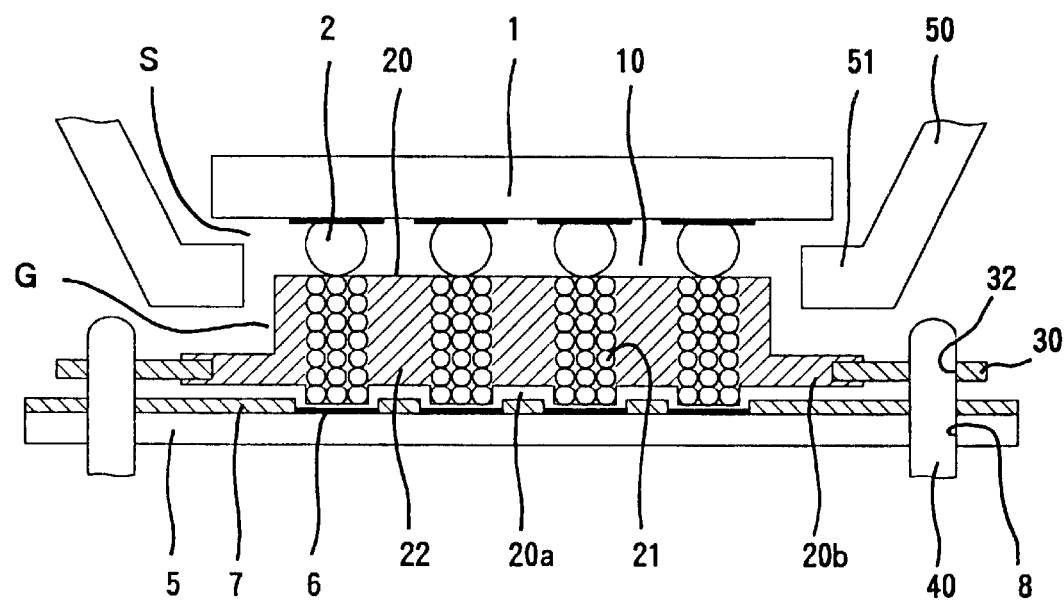
FIG. 2 is a cross-sectional view typically illustrating an electrically connected state of the anisotropically conductive sheet according to the present invention.

FIG. 1 is a plan view illustrating the whole construction of an exemplary anisotropically conductive sheet according to the present invention, and FIG. 2 is a cross-sectional view typically illustrating an electrically connected state of the anisotropically conductive sheet according to the present invention.

In this embodiment, an anisotropically conductive sheet constructed as a connector for conducting electrical inspection of circuit devices such as printed circuit boards and semiconductor integrated circuits will be described.

In the drawings, reference numeral 1 indicates a circuit device to be inspected, and reference numeral 5 designates a circuit board for connection used in the electrical inspection of the circuit device 1.

A plurality of electrodes 2 to be inspected are formed on the circuit device 1 to be inspected so as to project from the lower surface thereof.

On the circuit board 5 for connection, electrodes 6 for connection are formed on the upper surface thereof according to a pattern corresponding to the electrodes 2 to be inspected, and an insulating protective film 7 composed of, for example, an acrylic resin or epoxy resin is provided on other surface portions than the portions, on which the electrodes 6 for connection have been formed, in order to retain the insulating property of the circuit board 5 for connection and protecting the electrode pattern of the electrodes 6 for connection. In addition, through-holes 8, through which a guide pin 40 for positioning extending from an inspection apparatus (not illustrated) is inserted, are formed in the vicinity of the peripheral edge of the circuit board 5 for connection.

As illustrated in FIGS. 1 and 2, the anisotropically conductive sheet 10 according to this embodiment is constructed by an anisotropically conductive sheet body 20 and a support membrane 30 fixed to the peripheral edge part of the anisotropically conductive sheet body 20.

The support membrane 30 making up the anisotropically conductive sheet 10 is formed of, for example, a metal plate in the form of a rectangular frame, and the peripheral edge part of the anisotropically conductive sheet body 20 is fixed to the inner peripheral edge part of an opening 31 for providing the anisotropically conductive sheet body 20 in the central region thereof. Through-holes 32 extending in the thickness-wise direction of the support membrane 30 and fitting the outer diameter of the guide pin 40 are made in the support membrane 30.

The anisotropically conductive sheet body 20 making up the anisotropically conductive sheet 10 is constructed by a functional region part 20a in the form of, for example, a rectangle, and a peripheral region part 20b located about the functional region part 20a.

In the anisotropically conductive sheet body 20, the functional region part 20a comprises a plurality of conductive path-forming parts 21 which are arranged in a state mutually insulated by insulating parts 22 and exhibits anisotropical conductivity in the thickness-wise direction of the sheet body 20. The conductive path-forming parts 21 comprises a base material composed of an elastic polymeric substance and conductive particles contained in the base material in a state oriented so as to be arranged in the thickness-wise direction of the anisotropically conductive sheet body 20. More specifically, in each of the conductive path-forming parts 21 the conductive particles are closely filled over the whole base material composed of the elastic polymeric substance and extending in the thickness-wise direction of the sheet body 20 while in the insulating parts 22 the conductive particles are not present at all or scarcely present. The conductive path-forming parts 21 in this functional region part 20a are arranged according to a pattern corresponding to a pattern of the electrodes 2 to be inspected of the circuit device 1 to be inspected.

On the other hand, the peripheral region part 20b is formed of the same elastic polymeric substance as that forming the base material as above and has insulating property.

In the functional region part 20a of the anisotropically conductive sheet 10, the upper surface thereof is flat, and the upper surface of each of the conductive path-forming parts 21 is located at the same level as the upper surface of each of the insulating parts 22. On the other hand, the lower surface of each of the conductive path-forming parts 21 is formed in a state projected from the lower surface of each of the insulating parts 22.

In the anisotropically conductive sheet body 20, the thickness of the functional region part 20a is greater than that of the peripheral region part 20b, and the upper surface of the functional region part 20a is projected from the upper surface of the peripheral region part 20b and connected to the upper surface of the peripheral region part 20b with a difference G in level.

Figure 3:
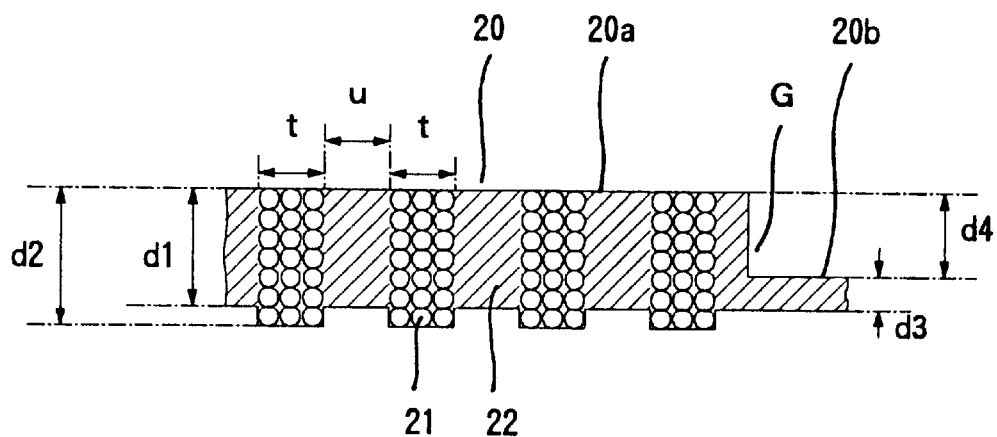
FIG. 3 is a cross-sectional view illustrating ratios between individual parts of the anisotropically conductive sheet.

In the functional region part 20a of the anisotropically conductive sheet body 20, as illustrated in FIG. 3, an aspect ratio A (d2/t) defined as a ratio of the thickness d2 of each of the conductive path-forming parts 21 to the maximum diameter t of the conductive path-forming part 21 is higher than 1.5, but not higher than 8, preferably not lower than 2, but not higher than 4.

If the aspect ratio A is not higher than 1.5, a size of d4 or (d1–d3) of the difference G in level becomes too small and it would be difficult to make a space enough large for inserting a holding tip part of a carier. If the aspect ratio A is higher than 8 on the other hand, such an anisotropically conductive sheet cannot be used in electrical inspection of any circuit device because the electric resistance value of the conductive path-forming parts becomes high.

In the functional region part 20a, a ratio B (d2/(t+u)) of the thickness d2 of the conductive path-forming part 21 to the minimum arrangement pitch (t+u) of the conductive path-forming parts 21 is not lower than 1, but not higher than 3, preferably not lower than 1, but not higher than 2.

If this ratio B is lower than 1, such an anisotropically conductive sheet cannot be used in electrical inspection of a circuit device to be inspected, in which electrodes to be inspected are arranged at a high density, because of its low resolution. If the ratio B is higher than 3 on the other hand, it is difficult to ensure insulating ability between adjacent conductive path-forming parts, and such an anisotropically conductive sheet cannot be used in electrical inspection of any circuit device to be inspected because the electric resistance value of the conductive path-forming parts becomes high.

Further, a ratio C (d2/d3) of the thickness d2 of the functional region part 20a to the thickness d3 of the peripheral region part 20b is higher than 1, but not higher than 5, preferably not lower than 2, but not higher than 4.

If the ratio C is not higher than 1, the size of d4 of the difference G in level becomes too small and it would be difficult to make a space enough large for inserting a holding tip part of a carier. On the other hand, if this ratio C is higher than 5, the thickness of the peripheral region part cannot be ensured because the thickness of the functional region part has to be regulated to a certain small size. It is hence not preferable to make the ratio C too high.

The size d4 (d1–d3) of the difference G in level is 0.1 mm or greater, preferably 0.3 mm or greater.

If the size d4 of the difference G in level is smaller than 0.1 mm, a space for insertion, which will be described subsequently, cannot be defined. Therefore, such an anisotropically conductive sheet fails to achieve its electrical connection easily to a circuit device to be inspected held and carried by, for example, a carrier or the like.

As the elastic polymeric substance forming the base material of the functional region part 20a of the anisotropically conductive sheet body 20 and the peripheral region part 20b making up such an anisotropically conductive sheet 10 as described above is preferred a polymeric substance having a crosslinked structure. As a curable polymeric substance-forming material used for obtaining the crosslinked polymeric substance, may be used various materials. Specific examples thereof include conjugated diene rubbers such as polybutadiene rubber, natural rubber, polyisoprene rubber, styrene-butadiene copolymer rubber and acrylonitrile-butadiene copolymer rubber and hydrogenated products thereof; block copolymer rubbers such as styrene-butadiene-diene block copolymer rubber and styrene-isoprene block copolymer rubber and hydrogenated products thereof; and besides chloroprene rubber, urethane rubber, polyester rubber, epichlorohydrin rubber, silicone rubber, ethylene-propylene copolymer rubber and ethylene-propylene-diene copolymer rubber.

When weather resistance is required of the resulting anisotropically conductive sheet 10, any other material than the conjugated diene rubbers is preferably used. It is particularly preferred to use silicone rubber from the viewpoints of molding and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

A suitable curing catalyst may be used to cure the polymeric substance-forming material. As such a curing catalyst, may be used an organic peroxide, a fatty acid azo compound, a catalyst for hydrosilylation, or the like.

Specific example of the organic peroxide used as the curing catalyst include benzoyl peroxide, bisdicyclobenzoyl peroxide, dicumyl peroxide and di-tert-butyl peroxide.

Specific example of the fatty acid azo compound used as the curing catalyst include azobisisobutyronitrile.

Specific examples of that used as the catalyst for hydrosilylation reaction include publicly known catalysts such as platinic chloride and salts thereof, platinum-unsaturated group-containing siloxane complexes, vinylsiloxane-platinum complexes, platinum-1,3-divinyltetramethyldisiloxane complexes, complexes of triorganophosphine or phosphite and platinum, acetyl acetate platinum chelates, and cyclic diene-platinum complexes.

In the base material of the functional region part 20a, may be contained a general inorganic filler such as silica powder, colloidal silica, aerogel silica or alumina as needed. By containing such an inorganic filler, the thixotropic property of the molding material for obtaining the anisotropically conductive sheet 10 can be ensured, the viscosity thereof becomes high, the dispersion stability of the conductive particles can be enhanced, and moreover the anisotropically conductive sheet 10 can be provided as that having high strength.

No particular limitation is imposed on the amount of such an inorganic filler used. However, the use in a large amount is not preferred because the orientation of the conductive particles by a magnetic field cannot be fully achieved.

As the conductive particles contained in the base material of the functional region part 20a, conductive particles exhibiting magnetism are preferably used from the viewpoint of the fact that they can be easily oriented so as to be arranged in the thickness-wise direction of the functional region part 20a by applying a magnetic field thereto. Specific examples of such conductive particles include particles of metals exhibiting magnetism, such as nickel, iron and cobalt, particles of alloys thereof and particles containing such metals; particles obtained by using these particles as core particles and plating the core particles with a metal having good conductivity, such as gold, silver, palladium or rhodium; particles obtained by using particles of a non-magnetic metal, inorganic particles such as glass beads or polymer particles as core particles and plating the core particles with a conductive magnetic material such as nickel or cobalt; and particles obtained by coating the core particles with both conductive magnetic material and metal having good conductivity.

Among these, particles obtained by using nickel particles as core particles and plating them with a metal having good conductivity, such as gold are preferably used.

No particular limitation is imposed on the means for coating the surfaces of the core particles with the conductive metal. However, the coating can be conducted by, for example, chemical plating or electroplating.

When particles obtained by coating the surfaces of core particles with the conductive metal are used as the conductive particles, a coating rate of the surfaces of the particles with the conductive metal, i.e. proportion of coated area of the conductive metal to the surface area of the core particles, is preferably at least 40%, more preferably at least 45%, particularly preferably 47 to 95% from the viewpoint of achieving good conductivity.

The amount of the conductive metal coated is preferably 0.5 to 50% by mass, more preferably 1 to 30% by mass, still more preferably 3 to 25% by mass, particularly preferably 4 to 20% by mass based on the core particles. When the conductive metal used for the coating is gold, the coating amount thereof is preferably 2.5 to 30% by mass, more preferably 3 to 20% by mass, still more preferably 3.5 to 15% by mass, particularly preferably 4 to 10% by mass based on the core particles. When the conductive metal used for the coating is silver, the coating amount thereof is preferably 3 to 50% by mass, more preferably 4 to 40% by mass, still more preferably 5 to 30% by mass, particularly preferably 6 to 20% by mass based on the core particles.

The particle diameter of the conductive particles is preferably 1 to 1,000 $\mu$m, more preferably 2 to 500 $\mu$m, still more preferably 5 to 300 $\mu$m, particularly preferably 10 to 200 $\mu$m.

The particle diameter distribution (Dw/Dn) of the conductive particles is preferably 1 to 10, more preferably 1.01 to 7, still more preferably 1.05 to 5, particularly preferably 1.1 to 4.

When conductive particles satisfying such conditions are used, the resulting functional region part 20a becomes easy to deform under pressure, and sufficient electrical contact is achieved among the conductive particles.

No particular limitation is imposed on the shape of the conductive particles. However, they are preferably in the shape of a sphere or star, or a mass of secondary particles obtained by aggregating these particles from the viewpoint of permitting easy dispersion of these particles in the polymeric substance-forming material.

The water content in the conductive particles is preferably at most 5%, more preferably at most 3%, still more preferably at most 2%, particularly preferably at most 1%. The use of the conductive particles satisfying such conditions can prevent or inhibit the occurrence of bubbles upon the curing treatment of the polymeric substance-forming material.

As the conductive particles, may be suitably used those the surfaces of which have been treated with a coupling agent such as a silane coupling agent. By treating the surfaces of the conductive particles with the coupling agent, the adhesive property of the conductive particles to the elastic polymeric substance is enhanced, so that the resulting functional region part 20a becomes high in durability upon repeated use.

The amount of the coupling agent used is suitably selected within limits not affecting the conductivity of the conductive particles. However, it is preferably such an amount that a coating rate of the surfaces of the conductive particles with the coupling agent, i.e. proportion of coated area of the coupling agent to the surface area of the conductive core particles, amounts to at least 5%, more preferably 7 to 100%, still more preferably 10 to 100%, particularly preferably 20 to 100%.

The anisotropically conductive sheet body 20 of such an anisotropically conductive sheet 10 can be produced, for example, in the following manner.

Figure 4:
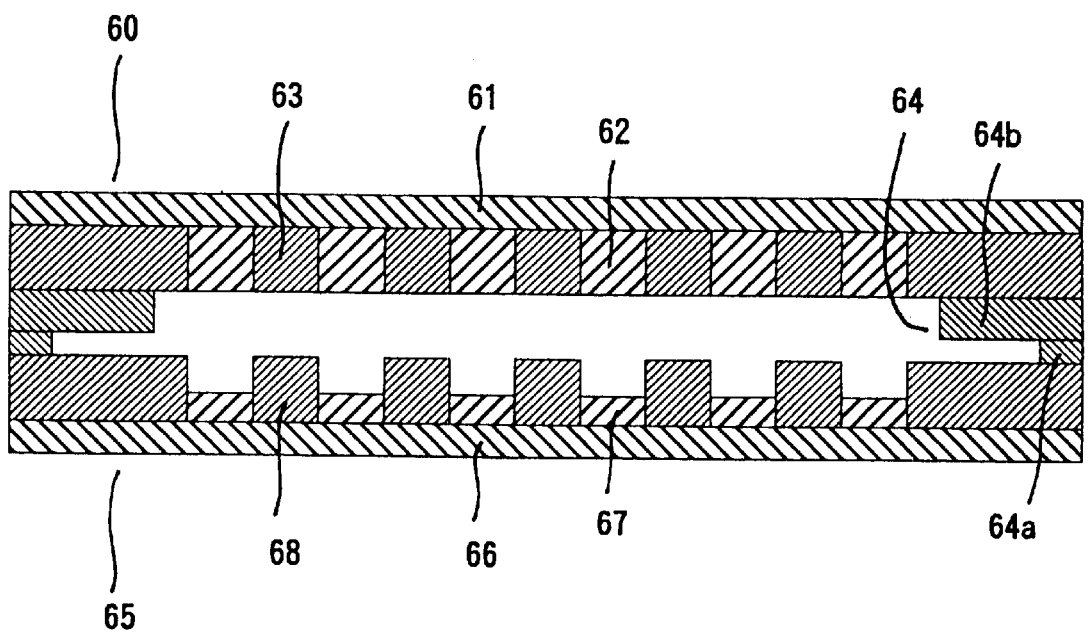
FIG. 4 is a cross-sectional view illustrating the construction of an exemplary mold used for producing an anisotropically conductive sheet body of the anisotropically conductive sheet according to the present invention.

FIG. 4 is a cross-sectional view illustrating the construction of an exemplary mold used for producing the anisotropically conductive sheet body of the anisotropically conductive sheet according to the present invention. The mold used in this embodiment is so constructed that a top force 60 and a bottom force 65 making a pair therewith are arranged so as to be opposed to each other through a frame-like spacer 64. A mold cavity is defined between the lower surface of the top force 60 and the upper surface of the bottom force 65.

The frame-like spacer 64 is used by combining a frame-like spacer body 64a having a thickness of d3 with a frame-like spacer body 64b having a thickness of d4 and superimposing them on each other so as to connect the upper surface of a functional region part 20a and the upper surface of a peripheral region part 20b in an anisotropically conductive sheet body 20 to be formed to each other with a difference G in level.

In the top force 60, a ferromagnetic material layer 62 is formed on the lower surface of a ferromagnetic base plate 61 according to a pattern corresponding to the arrangement pattern of the conductive path-forming parts 21 of the intended anisotropically conductive sheet body 20, and a non-magnetic material layer 63 having the same thickness as that of the ferromagnetic material layer 62 is formed at other areas than the ferromagnetic material layer 62.

In the bottom force 65 on the other hand, a ferromagnetic material layer 67 is formed on the upper surface of a ferromagnetic base plate 66 according to the same pattern as the arrangement pattern of the conductive path-forming parts 21 of the intended anisotropically conductive sheet body 20, and a non-magnetic material layer 68 having a thickness greater than that of the ferromagnetic material layer 67 is formed at other areas than the ferromagnetic material layer 67.

As a material for forming the ferromagnetic base plates 61, 66 in both top force 60 and bottom force 65, may be used a ferromagnetic metal such as iron, iron-nickel alloy, iron-cobalt alloy, nickel or cobalt. The ferromagnetic base plates 61, 66 preferably each have a thickness of 0.1 to 50 mm, and are preferably smooth in surfaces thereof and subjected to a chemical degreasing treatment or mechanical polishing treatment.

As a material for forming the ferromagnetic material layers 62, 67 in both top force 60 and bottom force 65, may be used a ferromagnetic metal such as iron, iron-nickel alloy, iron-cobalt alloy, nickel or cobalt. Among these, the iron, iron-nickel alloy or iron-cobalt alloy which generates a strong magnetic field is preferably used. The ferromagnetic material layers 62, 67 preferably each have a thickness of at least 10 $\mu$m.

As a material for forming the non-magnetic material layers 63, 68 in both top force 60 and bottom force 65, may be used a non-magnetic metal such as copper, a polymeric substance having heat resistance, or the like. However, a polymeric substance curable by radiation may preferably used in that the non-magnetic material layers 63, 68 can be easily formed by a technique of photolithography. As a material therefor, may be used, for example, a photoresist such as an acrylic type dry film resist, epoxy type liquid resist or polyimide type liquid resist.

The thickness of the non-magnetic material layers 63, 68 is preset according to the thickness of the ferromagnetic material layers 62, 67 and the projected height of each of the conductive path-forming parts 21 of the intended anisotropically conductive sheet body 20.

The anisotropically conductive sheet body 20 is produced by using the above-described mold in the following manner.

Figure 5:
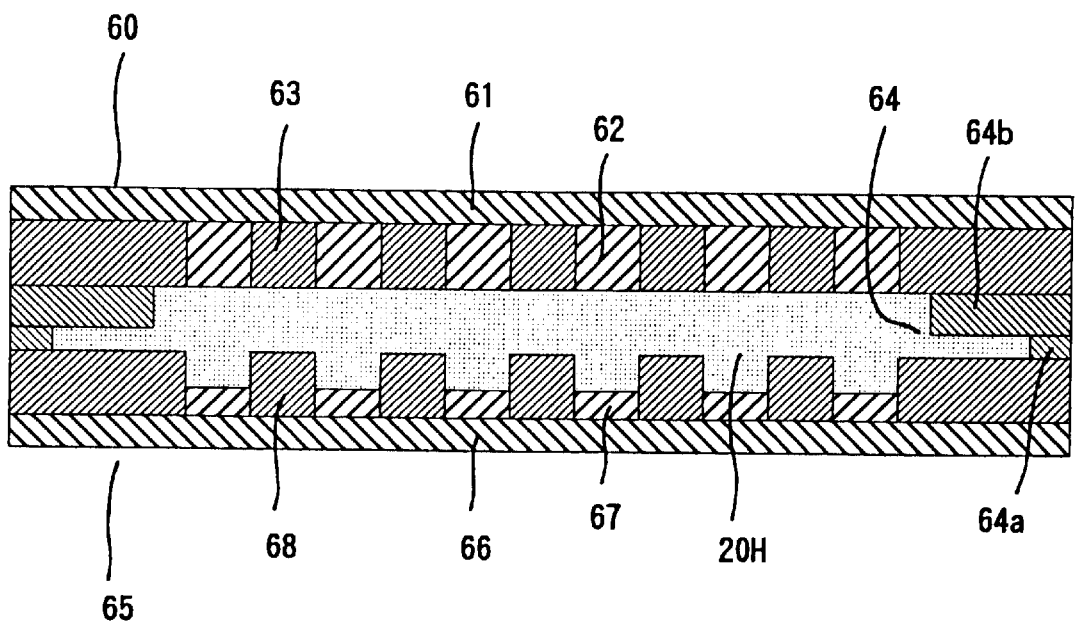
FIG. 5 is a cross-sectional view illustrating a state that a polymeric material layer has been formed in the mold shown in FIG. 4.

A fluid polymeric material with conductive particles, which exhibit magnetism, dispersed in a polymeric material-forming material is first prepared, and the polymeric material is filled into the mold cavity of the mold as illustrated in FIG. 5, thereby forming a polymeric material layer 20H.

Figure 6:
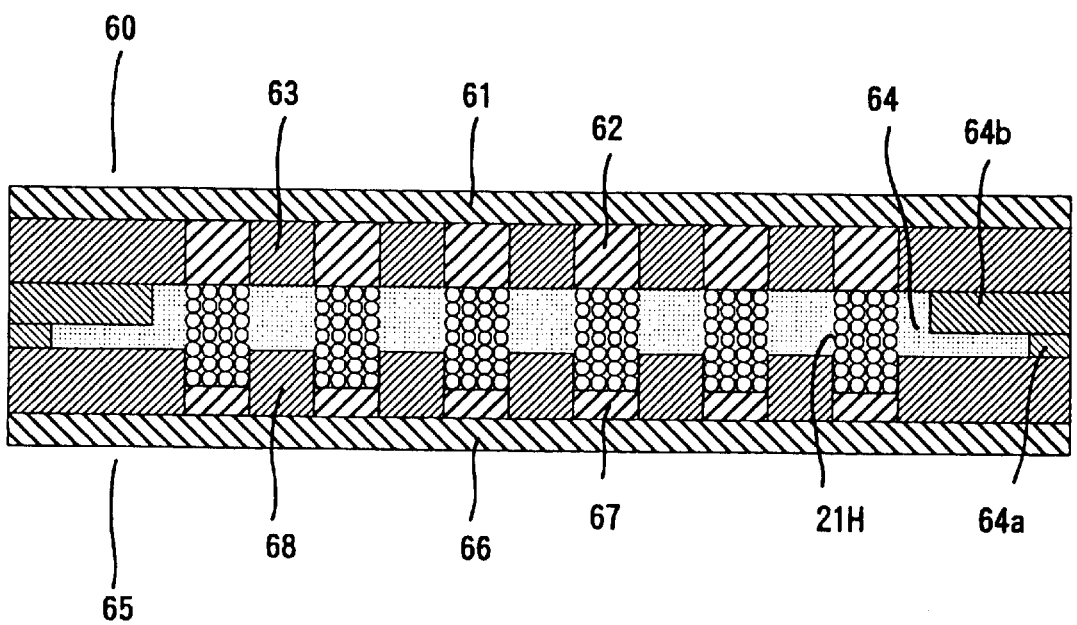
FIG. 6 is a cross-sectional view illustrating a state that conductive particles in the polymeric material layer have been congregated at portions which will become conductive path-forming parts in the polymeric material layer.

A pair of electromagnets, for example, are then arranged on the upper surface of the ferromagnetic base plate 61 in the top force 60 and the lower surface of the ferromagnetic base plate 66 in the bottom force 65, and the electromagnets are energized, thereby applying a parallel magnetic field having an intensity distribution, i.e., a parallel magnetic field having high intensity between the portions of the ferromagnetic material layer 62 in the top force 60 and their corresponding portions of the ferromagnetic material layer 67 in the bottom force 65, to the polymeric material layer 20H in the thickness-wise direction thereof. As a result, in the polymeric material layer 20H, the conductive particles dispersed in the polymeric material layer 20H are congregated at portions 21H, which will become conductive path-forming parts, located between the portions of the ferromagnetic material layer 62 in the top force 60 and their corresponding portions of the ferromagnetic material layer 67 in the bottom force 65 as illustrated in FIG. 6, and at the same time oriented so as to be arranged in the thickness-wise direction of the polymeric material layer 20H.

In this state, the polymeric material layer 20H is subjected to a curing treatment, thereby forming a functional region part 20a having conductive path-forming parts 21 arranged between the portions of the ferromagnetic material layer 62 in the top force 60 and their corresponding portions of the ferromagnetic material layer 67 in the bottom force 65, in which the conductive particles are closely filled in the elastic polymeric substance, and insulating parts 22 composed of the elastic polymeric substance, in which the conductive particles are not present at all or scarcely present. In addition, a peripheral region part 20b composed of the same polymeric substance same as the elastic polymeric substance forming the insulating parts 22 of the functional region part 22a is formed about the functional region part 22a, thereby producing an anisotropically conductive sheet body 20.

In the above-described process, the curing treatment of the polymeric material layer 20H may be conducted in the state that the parallel magnetic field has been applied. However, the treatment may also be conducted after stopping the application of the parallel magnetic field.

The intensity of the parallel magnetic field applied to the polymeric material layer 20H is preferably greater within limits not interfering with the production in order to orient the conductive particles so as to be arranged in the thickness-wise direction of the polymeric material layer 20H because the thickness d2 of the functional region part 20a to be formed is to be sufficiently great. Accordingly, the intensity of the parallel magnetic field is preferably an intensity that it amounts to at least 10,000 G, more preferably 20,000 to 30,000 G.

As a means for applying the parallel magnetic field to the polymeric material layer 20H, permanent magnets may also be used in place of the electromagnets. As such permanent magnets, are preferred those composed of alunico (Fe—Al—Ni—Co alloy), rare earth (Nd—Fe—B alloy) or the like in that the intensity of parallel magnetic field within the above range is achieved.

Means for the curing treatment of the polymeric material layer 20H is suitably selected according to the material used. However, the treatment is generally conducted by a heat treatment. Specific heating temperature and heating time are suitably selected in view of the kind of the polymeric substance forming the polymeric material layer 20H, the time required for transfer of the conductive particles, and the like.

As the following manner, the anisotropically conductive sheet 10 is used as a connector, for electrical connection between electrodes 2 to be inspected of a circuit device 1 to be inspected and electrodes 6 for connection formed on the upper surface of a circuit board 5 for connection according to a pattern corresponding to the pattern of the electrodes 2 to be inspected.

The anisotropically conductive sheet 10 is arranged on the upper surface of the circuit board 5 for connection in such a manner that the lower surfaces of the conductive path-forming parts 21 thereof are located on their corresponding electrodes 6 for connection of the circuit board 5 for connection, and fixed thereto. More specifically, the guide pins 40 passing through the through-holes 8 in the circuit board 5 for connection are respectively caused to pass through the through-holes 32 in the support membrane 30 making up the anisotropically conductive sheet 10, thereby fixing the anisotropically conductive sheet 10 to the upper surface of the circuit board 5 for connection.

A circuit device 1 to be inspected to be electrically connected to an inspection apparatus is held by holding claws 51 of a carrier 50, which engages with the lower surface of the circuit device to be inspected at a peripheral edge part thereof, in a state that electrodes 2 to be inspected have been exposed, and carried by the carrier to arrange it on the upper surface of the anisotropically conductive sheet 10 in such a manner that the electrodes 2 to be inspected are located on their corresponding conductive path-forming parts 21. At this state, the upper surface of the functional region part 20a of the anisotropically conductive sheet 10 is connected to the upper surface of the peripheral region part 20b with a difference G in level, whereby a space S which allows inserting of the holding claws 51 of the carrier is defined between the upper surface of the peripheral region part 20b and the circuit device 1 to be inspected opposing thereto, and the holding claws 51 of the carrier 50 are inserted into the space S for insertion.

While retaining this state, the circuit device 1 to be inspected is released from the carrier 50 and pressed downward against the circuit board 5 for connection, whereby the conductive path-forming parts 21 of the anisotropically conductive sheet 10 are electrically connected to the electrodes 2 to be inspected at the upper surfaces thereof and to the electrodes 6 for connection at the lower surfaces thereof. As a result, electrical connection between the electrodes 2 to be inspected and the electrodes 6 for connection is achieved through the conductive path-forming parts 21. The necessary electrical inspection of the circuit device 1 to be inspected is practiced in this state.

According to the anisotropically conductive sheet 10 of such a construction as described above, the functional region part 20a has a greater thickness than that of the peripheral region part 20b, and the upper surface thereof is projected from the upper surface of the peripheral region part 20b and connected to the upper surface of the peripheral region part 20b with a difference G in level, whereby the space S for insertion, in which the holding claws 51 of the carrier 50 can be inserted, is defined between the circuit device 1 to be inspected to be electrically connected and the upper surface of the peripheral region part 20b, and after all it is avoidable for the holding claws 51 of the carrier 50 to come into contact with the anisotropically conductive sheet 10 to interfere with the accurate location of the circuit device 1 to be inspected. As a result, the circuit device 1 to be inspected can be arranged at the prescribed position, and accurate electrical connection between the circuit device 1 to be inspected and the anisotropically conductive sheet 10 can be achieved with ease.

The aspect ratio A of each of the conductive path-forming parts 21 is higher than 1.5, but not higher than 8, whereby the space S for inserting a holding tip part of a carier may be obtained, while ensuring the required thickness of the functional region part 20a, and moreover the electrical conductivity of the conductive path-forming parts 21 can be made high.

The ratio B is not lower than 1, but not higher than 3, whereby the insulating ability between adjacent conductive path-forming parts 21 can be ensured while ensuring the required thickness of the functional region part 20a, and moreover resolution may become high.

The ratio C is higher than 1, but not higher than 5, whereby the size d4 of the difference G in level can be made sufficiently great, so that the space S for insertion defined between the lower surface of the circuit device 1 to be inspected arranged on the upper surface of the anisotropically conductive sheet 10 and the upper surface of the peripheral region part 20b of the anisotropically conductive sheet 10 can be made sufficiently great.

The size d4 of the difference G in level is at least 0.1 mm, whereby the space S for insertion defined when the circuit device 1 to be inspected to be electrically connected is arranged on the upper surface of the anisotropically conductive sheet 10 can be made sufficiently great.

Although the preferred embodiments of the present invention have been described above, various modifications may be made in the present invention.

For example, in the anisotropically conductive sheet 10 described above, the functional region part 20a is of the so-called unevenly distributed type in which a plurality of the conductive path-forming parts 21 each of which extends in the thickness-wise direction of the sheet are arranged in a state mutually insulated by the insulating parts 22. In the present invention, however, the functional region part may also be of the so-called evenly distributed type in which conductive particles are contained over the whole base material composed of the elastic polymeric substance.

In the anisotropically conductive sheet 10 described above, the lower surface of each of the conductive path-forming parts 21 is formed in a state projected from the lower surface of the insulating part 22. In the present invention, however, the lower surface of each of the conductive path-forming parts may also be located at the same level as the lower surface of the insulating part.

In the anisotropically conductive sheet 10 described above, the upper surface of each of the conductive path-forming parts 21 is located at the same level as the upper surface of the insulating part 21. In the present invention, however, the upper surface of each of the conductive path-forming parts may also be formed in a state projected from the upper surface of the insulating part.

Effect of the Invention

As described above, according to the anisotropically conductive sheets of the present invention, the functional region part has a greater thickness than that of the peripheral region part, and the upper surface thereof is projected from the upper surface of the peripheral region part and connected to the upper surface of the peripheral region part with a difference in level, whereby a space for inserting a holding tip part of a carrier is defined between a target to be electrically connected and the upper surface of the peripheral region part, and after all it is avoidable for the tip part of the carrier to come into contact with the anisotropically conductive sheet to interfere with the accurate location of the target. As a result, the target can be arranged at the prescribed position, and accurate electrical connection between the target and the anisotropically conductive sheets can be achieved with ease.

According to the connectors of the present invention, accurate electrical connection between a target to be electrically connected and the connectors can be achieved with ease because the connectors have the anisotropically conductive sheet.

What is claimed is:

1. An anisotropically conductive sheet comprising
   an anisotropically conductive functional region part
      exhibiting conductivity in its thickness-wise direction and
      comprising a plurality of conductive path-forming parts each extending in the thickness-wise direction of the sheet and arranged in a state insulated from one another by insulating parts, and
   an insulating peripheral region part located about the functional region part, wherein
      the thickness of the functional region part is greater than that of the peripheral region part, and
      the upper surface of the functional region part is projected from the upper surface of the peripheral region part and connected to the upper surface of the peripheral region part with a difference in level.

2. The anisotropically conductive sheet according to claim 1, wherein the difference in level between the upper surface of the functional region part and the upper surface of the peripheral region part makes a space for inserting a holding tip part of a carrier which engages with the lower surface of a peripheral edge part of a circuit device to be inspected arranged on the upper surface of the functional region part.

3. The anisotropically conductive sheet according to claim 2, wherein a ratio A of the thickness of each of the conductive path-forming parts to the maximum diameter thereof is higher than 1.5, but not higher than 8.

4. The anisotropically conductive sheet according to claim 2, wherein a ratio B of the thickness of the conductive path-forming part to the minimum arrangement pitch of the conductive path-forming parts is not lower than 1, but not higher than 3.

5. The anisotropically conductive sheet according to claim 2, wherein a ratio C of the thickness of the functional region part to the thickness of the peripheral region part is higher than 1, but not higher than 5.

6. The anisotropically conductive sheet according to claim 2, wherein the size of the difference in level between the upper surface of the functional region part and the upper surface of the peripheral region part is at least 0.1 mm.

7. A connector formed of the anisotropically conductive sheet of claim 1.

8. The anisotropically conductive sheet according to claim 3, wherein a ratio B of the thickness of the conductive path-forming part to the minimum arrangement pitch of the conductive path-forming parts is not lower than 1, but not higher than 3.

9. The anisotropically conductive sheet according to claim 8, wherein a ratio C of the thickness of the functional region part to the thickness of the peripheral region part is higher than 1, but not higher than 5.

10. The anisotropically conductive sheet according to claim 9, wherein the size of the difference in level between the upper surface of the functional region part and the upper surface of the peripheral region part is at least 0.1 mm.

11. A connector formed of the anisotropically conductive sheet of claim 3.

12. The anisotropically conductive sheet according to claim 4, wherein a ratio C of the thickness of the functional region part to the thickness of the peripheral region part is higher than 1, but not higher than 5.

13. The anisotropically conductive sheet according to claim 12, wherein the size of the difference in level between the upper surface of the functional region part and the upper surface of the peripheral region part is at least 0.1 mm.

14. A connector formed of the anisotropically conductive sheet of claim 4.

15. The anisotropically conductive sheet according to claim 5, wherein the size of the difference in level between the upper surface of the functional region part and the upper surface of the peripheral region part is at least 0.1 mm.

16. A connector formed of the anisotropically conductive sheet of claim 5.

17. The anisotropically conductive sheet according to claim 1, wherein the insulating parts of the functional region part and the insulating peripheral region part all comprise the same insulating material.

18. The anisotropically conductive sheet according to claim 17, wherein the upper surface of the functional region part is projected from the upper surface of the peripheral region part and connected to the upper surface of the peripheral region part with a difference in level by a connection surface encircling the entire functional region part.

* * * * *